United States Patent [19]

Haggerty et al.

[11] 3,944,640
[45] Mar. 16, 1976

[54] METHOD FOR FORMING REFRACTORY FIBERS BY LASER ENERGY

[75] Inventors: John S. Haggerty, Lincoln; Wilson P. Menashi, Lexington; Joseph F. Wenckus, Needham, all of Mass.

[73] Assignee: Arthur D. Little, Inc., Cambridge, Mass.

[22] Filed: June 14, 1973

[21] Appl. No.: 369,884

Related U.S. Application Data

[63] Continuation of Ser. No. 68,810, Sept. 2, 1970, abandoned.

[52] U.S. Cl. ............ 264/25; 264/DIG. 19; 264/64; 264/165; 264/176 F
[51] Int. Cl.² ........................................... B29B 3/02
[58] Field of Search ........... 264/165, 56, 65, 22, 25, 264/27, 64, 176

[56] References Cited
UNITED STATES PATENTS

| 196,776 | 4/1943 | Skaupy et al. | 264/165 |
|---|---|---|---|
| 2,313,296 | 3/1943 | Lamesch | 264/56 |
| 3,045,278 | 7/1962 | Potter | 264/165 |
| 3,081,485 | 3/1963 | Steigerwald | 264/290 |
| 3,177,057 | 4/1965 | Potter | 264/165 |
| 3,292,270 | 12/1966 | Spunt | 264/22 |
| 3,504,730 | 4/1970 | Dannohl | 264/56 |
| 3,523,345 | 8/1970 | Hughes | 264/168 |

FOREIGN PATENTS OR APPLICATIONS

| 931,975 | 7/1963 | United Kingdom | 264/81 |
|---|---|---|---|
| 1,226,473 | 3/1971 | United Kingdom | 264/81 |

*Primary Examiner*—Donald J. Arnold
*Attorney, Agent, or Firm*—Bessie A. Lepper

[57] ABSTRACT

Method and apparatus for forming fibers of refractory materials. A melt volume is continuously formed on a feed rod of the material to be fiberized and a fiber drawn therefrom. The melt volume is formed by introducing the feed rod at a predetermined velocity into a heating zone. The fiber diameter is determined by the relative velocities at which the feed rod is moved and the fiber drawn, and by the fractional density of the feed rod material.

9 Claims, 12 Drawing Figures

METHOD FOR FORMING REFRACTORY FIBERS BY LASER ENERGY

This application is a continuation of our Ser. No. 68,810 filed Sept. 2, 1970 and now abandoned.

This invention relates to method and apparatus for forming fibers from refractory materials, and more particularly to forming fibers from those refractory materials which do not lend themselves to fiberization by known methods and apparatus.

The term "refractory" is used hereinafter to designate materials which have relatively high melting points and which may or may not be highly corrosive. The term is meant to include amorphous and crystalline materials, including single crystal and polycrystalline forms; compounds such as alumina, thoria, zirconia etc., as well as elements such as boron and silicon.

Fibers of refractory oxides such as of aluminum, and perhaps of yttrium, zirconium and thorium, provide reinforcement for metal matrix composities such as turbine blades required for extended service use at temperatures in the range of 2000° to 2500°F. Fibers of boron-coated substrates of graphite or tungsten are also known to provide such reinforcing strength to metal structures. However, since the boron must be carried on a relatively heavy substrate, the effectiveness of the boron on a weight basis is materially reduced. Fibers of some of these refractory materials may also find applications in fiber optics for information transmission lines; some may be used as special purpose heater filaments; and some such as alumina and the like as feed stock for jewel bearing manufacture.

Aluminum oxide fibers are currently made by drawing the fibers from a molten pool of aluminum oxide contained in a crucible. This procedure presents problems in finding suitable crucible materials for the high melting materials as well as in attaining high purity in the fibers. Drawing from a large hot surface radiating to the fibers limits the fiber drawing rate because the rate of crystal growth depends upon the rate of heat dissipation at the growth interface. For the very high melting and corrosive materials there are no known suitable crucible materials and hence the prior art process is not suitable for producing fibers of such refractories as zirconia, thoria and boron.

It is therefore a primary object of this invention to provide an improved method of forming fibers of refractory materials, some of which have heretofore not been previously formed into fibers. It is another object to provide a method of the character described which makes it possible to produce fully crystalline (either single crystal or polycrystalline) fibers from low viscosity melts. An additional object of this invention is to provide a method of forming refractory fibers of extremely high purity. It is a further object to provide a method for forming pure boron fibers without substrates.

It is another primary object of this invention to provide apparatus suitable for forming high purity refractory fibers without the need for a crucible to contain a molten mass of the material. Another object is to provide apparatus of the character described which permits forming fibers of materials which heretofore have not been formed into fibers. Other objects of the invention will in part be obvious and will in part be apparent hereinafter.

The invention accordingly comprises the several steps and the relation of one or more of such steps with respect to each of the others, and the apparatus embodying features of construction, combinations of elements and arrangement of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawings in which FIG. 1 is an enlarged cross section showing the relationship among the feed rod, melt volume and fiber as formed in the method of this invention;

In the method of this invention a heating zone is provided and into this heating zone is introduced a feed rod of the refractory to be fiberized. The heating zone is maintained at a sufficiently high temperature to form a melt volume which is supported (either through surface tension or force of gravity or a combination of these) on the end of the feed rod being introduced into the heating zone. As the feed rod is introduced into the heating zone a fiber is drawn from the melt and no melt container is required.

In brief, the apparatus of this invention comprises means to provide a heating zone, and means to introduce the feed rod into the heating zone and for drawing a fiber from the melt volume formed on the feed rod. It may also include means to provide a controlled fluid atmosphere around the system.

Figure 1:
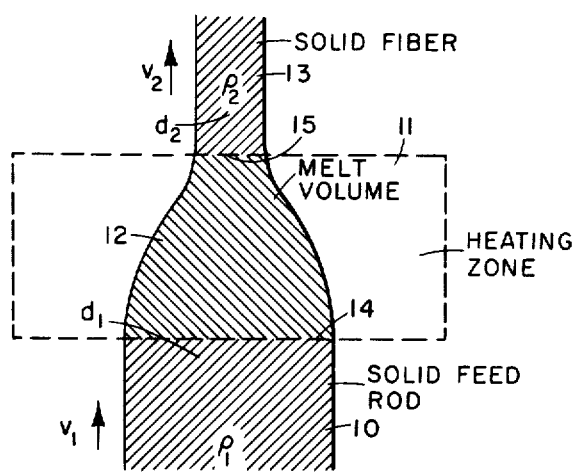

Before describing various embodiments of the apparatus for moving the feed rod and drawing the fibers and for providing the heating zone, it will be helpful to describe the method with reference to FIG. 1 which is an enlarged cross section of the fiber-forming section of the system. A solid feed rod 10 with a fractional density $\rho_1$ and diameter $d_1$ is introduced at a velocity of $v_1$ into the heating zone 11 to form a melt volume 12 from which is drawn a solid fiber 13, having a fractional density $\rho_2$ and diameter $d_2$, at a velocity $v_2$. As shown in the drawings, the length of heating zone 11 is controlled to be no greater than the length of melt volume 12. Of course there may be on either side of this heating zone, in which the melt volume is formed, other heated regions for purposes of preheating the feed rod and/or postheating the fiber formed. In order to establish a stable system permitting the drawing of the continuous fiber 13, the mass flow rate crossing the solid-liquid boundary 14 between the solid rod 10 and melt volume 12 and the mass flow rate crossing the liquid-solid boundary 15 between melt volume 12 and solid fiber 13 must be equal. Since the mass flow rate is equal to the product of fractional density, velocity and cross sectional area, the required stable system is attained when $$\rho_1 v_1 \frac{\pi}{4} d_1^2 = \rho_2 v_2 \frac{\pi}{4} d_2^2.$$

Thus, assuming that the fractional density of the feed rod is substantially 100%, the velocity at which the fiber is drawn essentially determines its diameter. However, the feed rod need not have a fractional density approximating 100% so long as this factor is taken into account in determining the relative velocities of the feed rod and fiber.

It will be apparent that there are two types of forces acting upon the melt volume within the heating zones, namely surface tension forces and gravitational forces. However, when the dimension (diameter) of the feed rod is reduced below a predeterminable minimum, the gravitational forces become negligible compared to the surface tension forces, a fact which means that orientation of the axis of the feed rod and fiber is no longer important. The actual diameter of the feed rod at which gravitational forces no longer exert control over the fiber forming process varies from one refractory material to another and depends upon such factors as melt density, viscosity, surface tension and the like.

It can, for example, be shown analytically that in small diameter processes (feed rod diameter no greater than 0.1 inch with a density of about 4 g/cm$^3$ and a surface tension around 400 ergs per cubic centimeter) that the method of this invention is highly stable in terms of remaining intact and returning to a condition where the tangent of the molten volume 12 is parallel to the fiber (direction of growth) at the solidifying interface 15. This feature enhances the uniformity of the fiber diameter. The melt volume is absolutely stable to perturbations from its equilibrium shape as long as the two following inequalities are met $$\frac{\text{Radius of feed rod}}{\text{radius of fiber}} \leq 6.7$$

and $$\frac{\text{melting volume height}}{\text{radius of fiber}} \leq 5.7$$

These conditions can probably be exceeded while retaining high degrees of stability with metastable zones.

Figure 2:
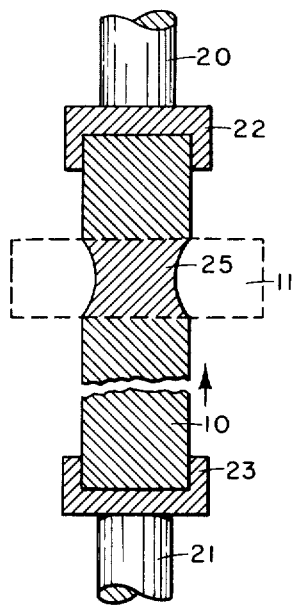
FIG. 2 illustrates one way in which the fiber drawing process is begun.

In the apparatus of this invention it is necessary to provide two precisely aligned solid members (feed rod and fiber) with a melt volume joining them and means to move these two solid members at different translational velocities. As a suitable means for holding these two members and imparting different translational velocities to them we cite the apparatus described in copending application Ser. No. 653,478 filed July 14, 1967 and now U.S. Pat. No. 3,552,931 assigned to the same assignee as this application. The apparatus of Ser. No. 653,478 provides means to move two load-bearing rods such as upper rod 20 and lower rod 21 shown in FIG. 2. Each of these rods has a chuck 22 and 23, respectively, adapted to grasp the two solid members in alignment. In FIG. 2, which illustrates one way in which the fiber drawing process may be started, chucks 22 and 23 are adapted to grasp the two ends of a feed rod 10 and to position the feed rod near its upper end within the heating zone 11. With the application of heat the portion 25 of the feed rod within heating zone 11 is melted and the fiber drawing process is begun by moving load-bearing rods 20 and 21 upwardly at predetermined velocities. It is also, of course, possible to move them in a downwardly direction provided the positions of the feed rod and fiber are reversed.

As noted above, if the diameter of the feed rod is below a determinable value, the gravitational forces influencing the stability of the melt volume 12 are no longer important so that fiber drawing may be accomplished with any orientation of the feed rod and fiber axes. Thus, FIG. 3 illustrates the drawing of the fiber, begun as illustrated in FIG. 2, with the axis of the feed rod 10 and fiber 13 in a horizontal orientation.

Figure 3:
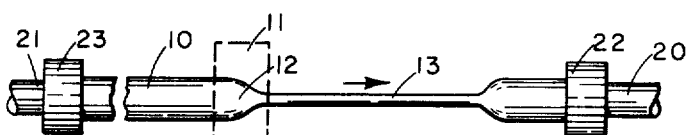
FIG. 3 shows the drawing of the fiber subsequent to the beginning of the process according to FIG. 2 and oriented for horizontal drawing.
Figures 4, 5:
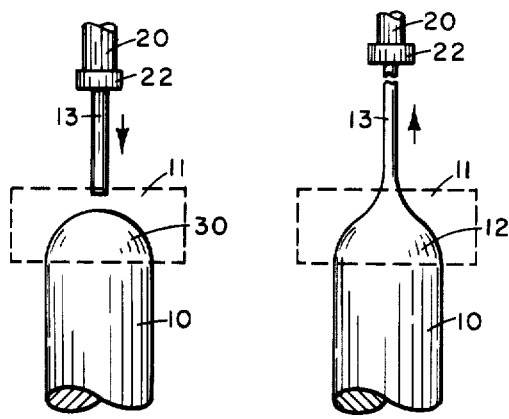
FIG. 4 illustrates another way in which the fiber drawing process is begun.
FIG. 5 illustrates the continuance of the method begun as in FIG. 4.

FIGS. 4 and 5, in which like reference numerals are used to refer to like components of FIGS. 1–3, illustrate another technique for beginning the method of fiber drawing. The top of the feed rod 10, held in a suitable chuck such as shown in FIG. 2, is introduced into heating zone 11 to form there a melt meniscus 30 into which a short fiber 13 is inserted or brought into surface contact. With the formation of the desired melt volume the movement of the rod and fiber is begun.

In the apparatus of FIGS. 2–5 a feed rod of a fixed length was illustrated. It is, however, possible to continue to supply the solid rod in an indeterminant length by directing it up through a suitably aligned extruding mechanism as illustrated, partly in cross section in FIG. 6. The material to be fiberized is introduced at a constant rate from a feed line 30 into a hopper 31 which directs the powdered feed into an extruder 32 having a rotating feed screw 33 which compacts the material into a feed rod 34. The material may contain a thermally decomposable binder to form a more compact preliminary feed rod. This preliminary feed rod 34 is maintained in alignment and advanced upwardly by a series of properly spaced friction drive rollers 35. The preliminary feed rod 34 is then passed through a preliminary heating zone 36 where it is refined, densified and freed of any binder which may have been added to the powder feed. The feed rod 10 thus formed is then drawn upwardly from the preliminary heating zone 36 into the fiber forming heating zone 11 by suitable aligning and moving means such as friction drive rollers 37. The rates at which the preliminary feed rod 34 and final feed rod 10 are moved will normally be about equal, the diameters of the two rods being kept essentially equal. The fiber 13 is then drawn in the manner described from the melt volume 12. Alternatively, the melt refining in heating zone 36 may be omitted if a fiber of somewhat lower quality is satisfactory.

Figure 6:
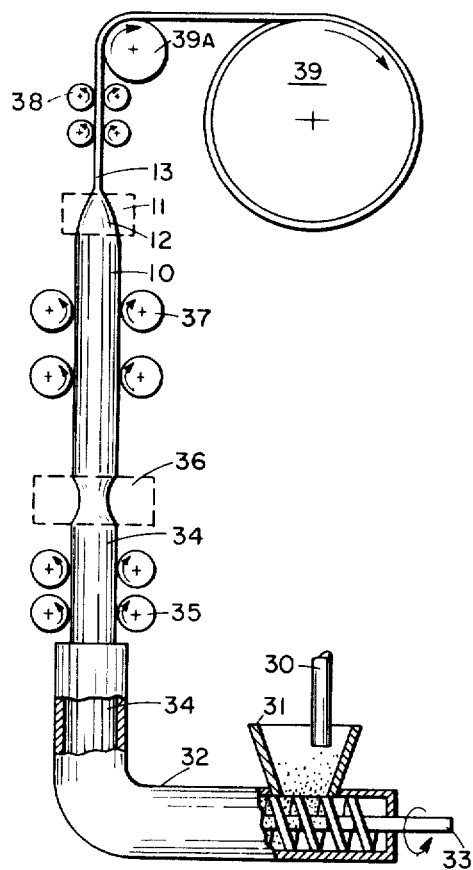
FIG. 6 illustrates in cross section an embodiment of the process and apparatus in which the feed rod is formed and provided to the heating zone by extrusion.

As also shown in FIG. 6, the apparatus of this invention may be provided with means for handling long continuous fibers. As illustrated, the fiber 13 is drawn by using pulling rollers 38 and is passed over a guide roll 39a to a rotating spool 39 or other suitable collection means.

A number of other techniques may also be employed to provide an essentially continuous feed rod. As an example of one such technique, feed rods of a finite length may be used and connected one to the other as they are used, such connections being made through properly tapered joints or threaded ends. As another example of another technique for providing essentially continuous feed rods, relatively large diameter fibers may be used as the feed rod. It is also, of course, within the scope of this invention to use other than thermally decomposable binders, e.g., those which may be leached out with alcohol.

Figure 7:
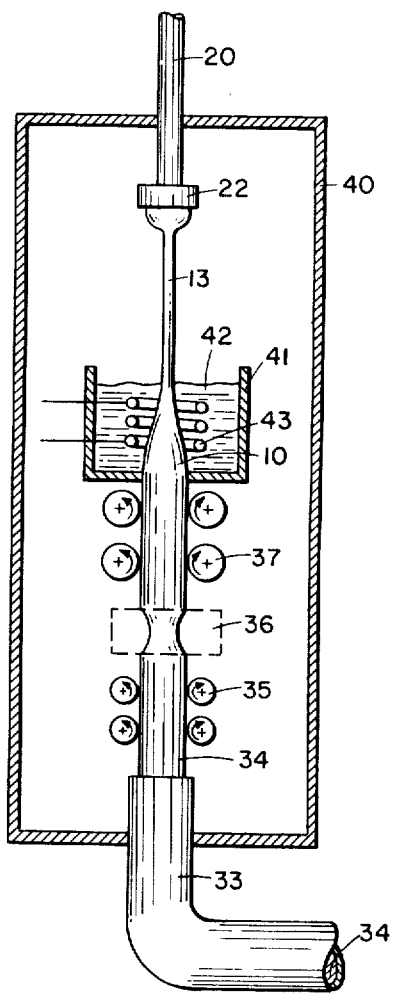
FIG. 7 is a representation, partly in cross section, of a feed system in which the feed rod is extruded, the heating zone is encapsulated in a fluid and the atmosphere around the fiberization process is controllable.

In the apparatus of FIG. 7 means are provided to control the atmosphere around the entire fiber forming system and also around the part of the system where the fiber is actually formed by drawing from the melt volume. In handling some materials which contain one or more volatile components in the melt stage such as arsenic and phosphorus, it is necessary to encapsulate the melt and in some cases to work under pressures which are greater than the vapor pressure of the volatile component. In some other circumstance, it may be advantageous to be able to reduce the forces on the melt volume in drawing the fiber. The latter situation is presumed in FIG. 7. (The apparatus of FIG. 7 is of course, adaptable to pulling fibers of such materials as gallium arsenide or gallium phosphide by using a feed rod which does not first need preheating.)

The fiber forming system of FIG. 7, which uses the means for continuously supplying a feed rod of FIG. 6, is enclosed in a fluid-tight chamber 40 which may be pressurized if desired. The feed rod is introduced through the bottom of a vessel 41 containing a liquid encapsulant 42 in which is embedded an r.f. coil exemplary of a suitable heating means. The liquid encapsulant should have a density which approximates the density of the melt and is inert to the melt as well as to all other material it contacts. The liquid encapsulant should also of course be compatible with the heating means and not interfere with its function. For example, in the apparatus of FIG. 7 which uses an r.f. heater the liquid encapsulant should not be electrically conducting at the frequencies employed in the heater. Exemplary of encapsulants which are suitable are boric oxide, barium oxide and these oxides in admixture with barium chloride and sodium fluoride.

The use of an encapsulant used as shown in FIG. 7 may have advantages for certain systems. For example, a liquid encapsulant, which has a density that approximates the density of the melt, reduces the body forces on the melt volume. Thus the surface energy is that of a liquid-liquid interface rather than that of a gas-liquid interface and hence the tendency to neck off is reduced. Finally, such a liquid encapsulant acts as a heat sink thus increasing the rate at which the fiber solidifies.

FIGS. 8–12 illustrate several different means for establishing the required heating zone which must be stable and have relatively well defined limits with respect to the melt volume such that premature heating of the feed rod is prevented and heating of the fiber formed is minimized. The choice among the various means available will depend upon the temperature which must be attained in the heating zone, the desirability of being able continuously to observe the fiber forming process and the need for controlling the atmosphere or environment surrounding the heating zone.

Figure 8:
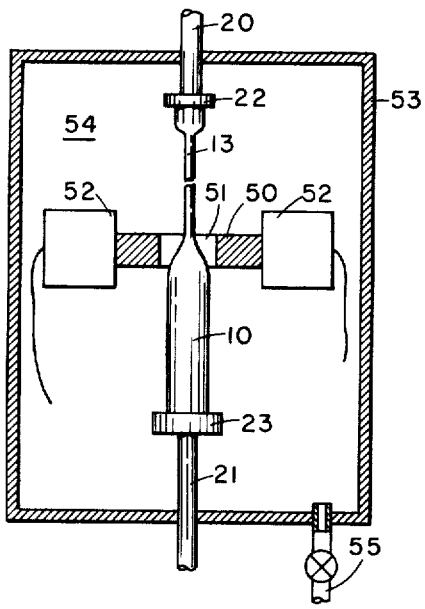
FIG. 8 is a representation, partly in cross section, of an incandescent heating system including means to control the atmosphere around the fiber formation zone.

The apparatus of FIG. 8 employs incandescent heating and provides means for controlling the environment around the heating zone. (In FIGS. 8–12 the means for moving the feed rods and fibers are not detailed except where required.) In all the drawings like reference numerals refer to like components. In FIG. 8, heating is provided by means of an incandescent filament 50 which may be in the form of a strip having a circular opening 51 defining the heating zone. The filament 50 is connected to two water-cooled copper electrodes 52 which in turn are connected to a suitable power supply, not shown. The filament 50 may typically be formed of graphite to obtain temperatures between 2400° and 2800°C and tungsten to obtain temperatures of about 3000°C. Because graphite and tungsten readily oxidize at these temperatures it is necessary to provide a non-oxidizing atmosphere surrounding the filament and the heating zone. In the apparatus of FIG. 7 an essentially fluid-tight housing 53 provides a volume 54 which may be evacuated or charged, through a valve-controlled line 55, with a gas which is inert to the melt. The mechanism for imparting translational motion (and rotational motion, if desired) described in the above-mentioned Ser. No. 653,478 is designed to operate within a fluid-tight housing which may be evacuated or pressurized and provides the necessary sealing means which permit the actual driving mechanisms for the loadbearing rods 20 and 21 to be located external of housing 53.

Figure 9:
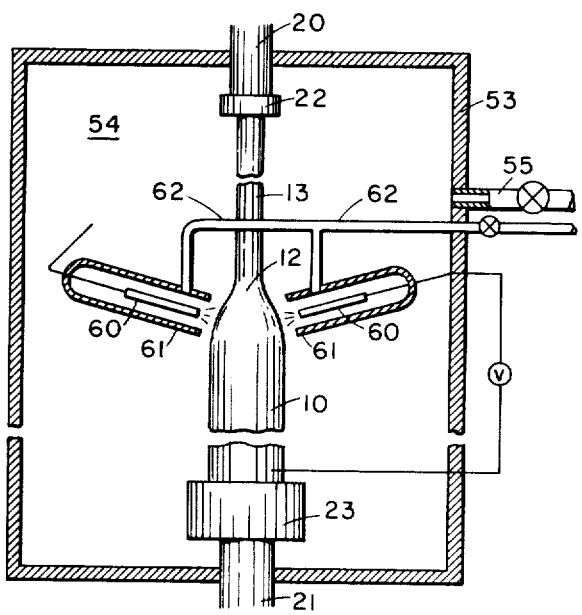
FIG. 9 is a representation, partly in cross section, of an apparatus suitable for providing the necessary heating zone through the establishment of an arc using the feed rod as one of the electrodes.

If the refractory material to be fiberized is electrically conductive, it may be used as one electrode in an arc heating system as shown in FIG. 9. A plurality of electrodes 60 symmetrically positioned around the melt volume 12 are encased in electrode housings 61 which are open at the end facing the melt volume. The housings 61 are connected through suitable vacuum tubing 62 to a vacuum pump (not shown). As in the case of the apparatus of FIG. 8, the system is contained within a fluidtight housing 53, the internal volume 54 of which may be evacuated through valve-controlled line 55. In a typical mode of operation the pressure in volume 54 may be reduced to about 20 microns Hg and the pressure within the electrode housings 61 to about $10^{-6}$ torr. By applying appropriate voltage across the feed rod 10 and the electrode 60, it is possible to establish a series of arcs capable of generating sufficient heat to form the required melt volume.

Figure 10:
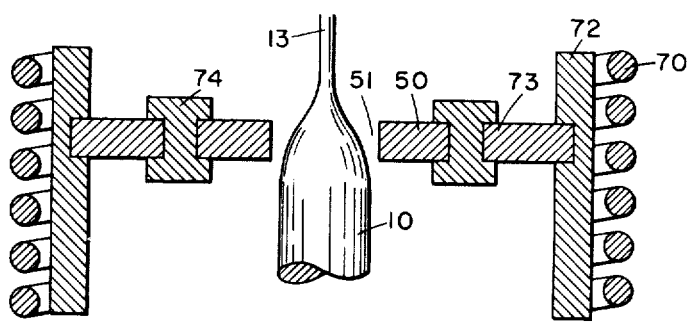
FIG. 10 is a representation, partly in cross section, of an apparatus in which the heating zone is provided through the use of an incandescent heater heated by an r.f. coil.

In the apparatus of FIG. 10, heating is done by means of an r.f. coil 70 inductively coupled to a graphite ring 50 (which in effect becomes an incandescent filament) through water-cooled copper electrodes 72, copper ring 73 and a boron nitride insulator ring 74. A modification of the apparatus of FIG. 10 is suitable for making fibers of electrically conducting materials such as pure boron fibers by direct inductive coupling of the feed rod with the r.f. coils. The feed material must, however, be electrically conducting at appropriate frequencies and temperatures; and in such a system the frequency of the r.f. heating system must be adjusted with respect to the fiber diameter. The higher the frequency, the lower is the skin depth penetration; hence the fiber must be larger than this skin depth penetration.

In addition to the heat sources described above it is also possible to use thermal imaging, electron beams, gas discharge, direct flame systems and hollow cathode plasma heaters (see for example Class et al, "Crystal Growth" in "Proceedings of an International Conference on Crystal Growth," Boston, 1966, Published by Pergamon Press, 1967, page 75). Finally, lasers with appropriate optical systems may be used.

Figure 11:
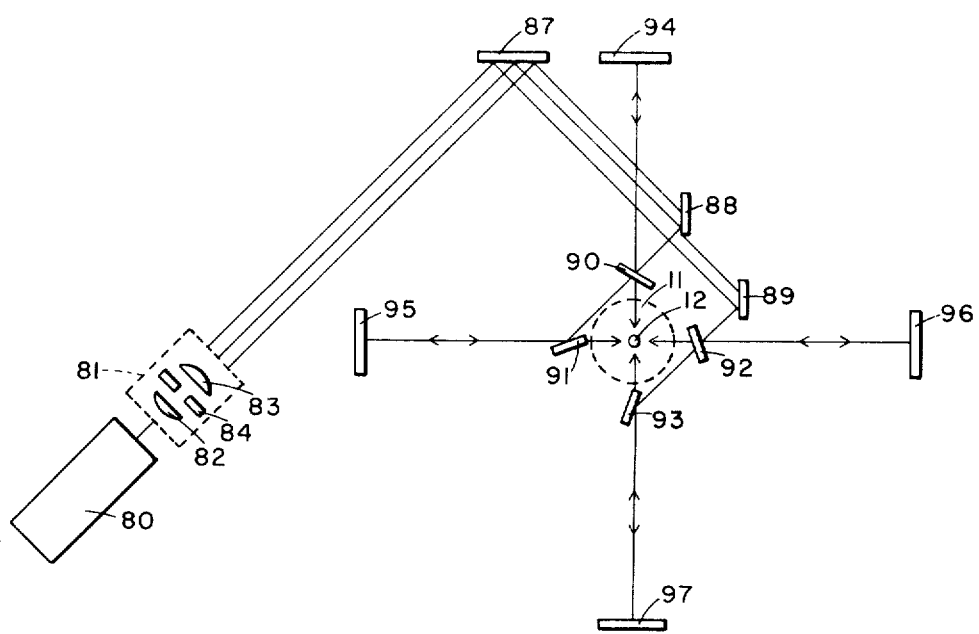
FIG. 11 is a top plan view of an optical system using a laser as the means for providing a heating zone.
Figure 12:
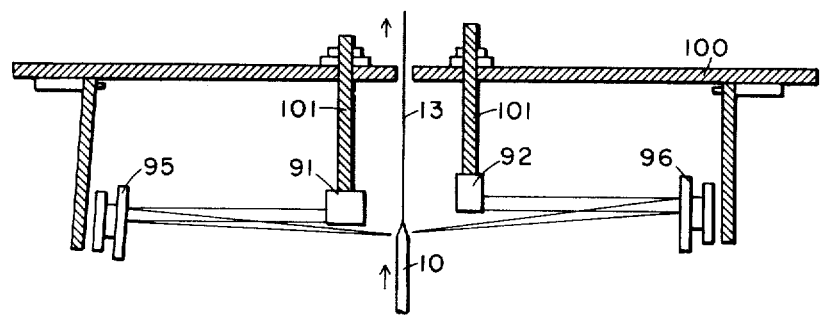
FIG. 12 is a cross sectional view through the optical system of FIG. 11 showing the spatial locations of the mirrors used.

As will be apparent from the discussion of the apparatus of FIGS. 11 and 12, which show the use of a laser, this lastnamed system has distinct advantages for the method of this invention. Where incandescent heating systems emit a large part of their radiation in a wavelength range to which many of the refractories in their molten state are transparent, the laser can be chosen to avoid this difficulty. Incandenscent systems may pose problems of heat transfer to the fiber after formation; but laser energy can be directed to avoid such problems. Laser energy has no characteristic temperature of its own, no upper temperature limitations and the use of lasers imposes no restriction on the atmosphere in which the fiber is formed. Finally, as will be seen from the description of FIGS. 11 and 12, the use of a laser permits visual observation of the process.

FIG. 11 is a schematic representation of an optical system using a laser. Radiation from laser 80 is passed through a beam expander 81 typically formed of lenses 82 and 83 and an aperture 84. The expanded beam strikes plane mirror 87 and is reflected on plane mirrors 88 and 89 positioned such that each of these mirrors receives a half-circle of the beam. The semicircular beam from mirror 88 is interrupted by plane mirrors 90 and 91 positioned in the vertical plane such that each mirror 90 and 91 receives a quadrant of the beam. In like manner the semicircular beam from mirror 89 is interrupted by plane mirrors 92 and 93 also positioned in the vertical plane such that mirrors 92 and 93 also receive a quadrant of the beam. A quadrant is reflected from plane mirror 90 to the spherical mirror 94 which in turh is so positioned to focus the reflected beam on the melt volume 12 located in the heating zone 11. In like manner the quadrant of the beam striking mirror 91 is reflected and focused by spherical mirror 95, the quadrant striking mirror 92 is reflected and focused by spherical mirror 96 and the quadrant striking mirror 94 is reflected and focused by spherical mirror 97. It is possible to divide the laser beam into two or more beams for focusing in a similar manner. However, the beams should be symmetrically arranged to provide a stable heating zone.

FIG. 12 which is a cross section through the optical system shows the manner in which the plane mirrors are hung from a jig 100, by adjustable supports 101, to attain the desired vertical positioning which permits the splitting of the laser beam and its refocusing in four beams at the heating zone. The jig and spherical mirrors can be mounted in any suitable manner and the feed rod and fibers are moved as shown in FIG. 2.

Using the optical system of FIGS. 11 and 12 and a 10-watt Holobeam CW $CO_2$ laser, the 0.2 inch beam of which was expanded to a ¾ inch beam, fibers of alumina ranging in diameter from 0.005 to 0.020 inch were drawn from feed rods of 0.015 to 0.020 inch diameters.

It will be appreciated that the apparatus of FIGS. 11 and 12 represent only one of a number of possible ways in which lasers may be used to create the required heating zone. Any one of a number of optical systems may be used with one or more lasers. It is also, of course, possible to use several lasers, the beams of which are focused at a common point to generate the desired heating. It is also within the scope of the invention to draw more than one fiber simultaneously from the melt volume.

By the method and apparatus of this invention refractory fibers ranging in diameter from 0.005 to 0.060 inch have been formed. Since contamination is not a problem the purity of the fiber is controlled by the purity of the feed rod. Since present techniques now make it possible to provide essentially pure feed material it means that pure fibers may be made. The method and apparatus of this invention are appliable to a wide variety of materials which have previously been formed into fibers only with great difficulty or which have not previously lent themselves to fiber formation.

It will thus be seen that the objects set forth above, among those made apparent from the preceding description, are efficiently attained and, since certain changes may be made in carrying out the above method and in the constructions set forth without departing from the scope of the invention, it is intended that all matter contained in the above description or shown in the accompanying drawings shall be interpreted as illustrative and not in a limiting sense.

We claim:

1. A method of forming refractory fibers comprising the steps of
   a. providing a heating zone by concentrating laser energy within said zone, said laser energy being of a character to melt the refractory material to be fiberized;
   b. introducing a feed rod of said refractory material into said heating zone thereby to form a stable melt volume of said refractory supported principally through surface tension forces on said feed rod within said heating zone;
   c. drawing a fiber from said melt volume, said drawing of said fiber being so controlled so that the product of fiber fractional density, drawing velocity and cross sectional area is maintained equal to the product of feed rod fractional density, the velocity at which said rod is introduced into said heating zone and cross sectional area of said rod, and the ratio of the radius of said feed rod to the radius of said fiber and the ratio of the height of said melt volume to the radius of said fiber is such as to retain a high degree of stability; and
   d. controlling the length of said heating zone so that it is no greater than the length of said melt volume.

2. A method in accordance with claim 1 wherein the step of providing a heating zone by concentrating laser energy within said zone comprises focusing a plurality of laser beams onto the surface of said melt volume.

3. A method in accordance with claim 1 including the step of providing controlled fluid surroundings around at least said melt volume.

4. A method in accordance with claim 1 wherein the dirreaction of motion of said feed rod and said fiber is essentially vertically upward.

5. A method in accordance with claim 1 wherein the direction of motion of said feed rod and said fiber is essentially vertically downward.

6. A method in accordance with claim 1 wherein the step of introducing said feed rod into said heating zone is continuous and comprises continuously compacting said refractory in powder form and extruding it as said feed rod.

7. A method in accordance with claim 6 including the step of zone heating the extruded feed rod prior to introducing it into said heating zone.

8. A method in accordance with claim 1 wherein the step of introducing said feed rod into said heating zone comprises joining feed rods of finite length as they are consumed.

9. A method in accordance with claim 1 including the step of winding the fiber as produced on a spool.

* * * * *